United States Patent
Nagano et al.

(10) Patent No.: US 10,802,055 B2
(45) Date of Patent: Oct. 13, 2020

(54) CORE MEMBER, GAPPED CORE, CURRENT SENSOR, AND METHOD FOR MANUFACTURING GAPPED CORE

(71) Applicant: SHT Corporation Limited, Izumisano-shi, Osaka (JP)

(72) Inventors: Ai Nagano, Izumisano (JP); Takashi Yoshimori, Izumisano (JP); Hitoshi Yoshimori, Izumisano (JP)

(73) Assignee: SHT CORPORATION LIMITED, Osaka (JP)

( * ) Notice: Subject to any disclaimer, the term of this patent is extended or adjusted under 35 U.S.C. 154(b) by 174 days.

(21) Appl. No.: 16/074,944

(22) PCT Filed: Sep. 19, 2017

(86) PCT No.: PCT/JP2017/033631
§ 371 (c)(1),
(2) Date: Aug. 2, 2018

(87) PCT Pub. No.: WO2018/061850
PCT Pub. Date: Apr. 5, 2018

(65) Prior Publication Data
US 2019/0033346 A1 Jan. 31, 2019

(30) Foreign Application Priority Data
Sep. 29, 2016 (JP) .................. 2016-190880

(51) Int. Cl.
*G01R 15/20* (2006.01)
*H01F 41/12* (2006.01)
(Continued)

(52) U.S. Cl.
CPC ............ *G01R 15/20* (2013.01); *H01F 27/022* (2013.01); *H01F 27/24* (2013.01); *H01F 37/00* (2013.01);
(Continued)

(58) Field of Classification Search
CPC .... G01R 15/20; G01R 15/202; G01R 15/205; G01R 15/18; G01R 15/183; G01R 15/186;
(Continued)

(56) References Cited

U.S. PATENT DOCUMENTS

2005/0237049 A1 10/2005 Ozaki et al.
2012/0217963 A1* 8/2012 Naka ................. H01F 38/30
324/253
2014/0333293 A1* 11/2014 Sakai ................. G01R 15/183
324/127

FOREIGN PATENT DOCUMENTS

CN 104024869 A 9/2014
DE 11 2012 005 498 T5 9/2014
(Continued)

OTHER PUBLICATIONS

[Machine Translation] Japanese Unexamined Patent Publication 2007-088019, May 4, 2007, 11 pp. (English language translation).
(Continued)

*Primary Examiner* — Son T Le
(74) *Attorney, Agent, or Firm* — Eckert Seamans Cherin & Mellott, LLC (57) ABSTRACT

The present invention provides a core member, a gapped core, and a current sensor in which the gap width of a core main body that is entirely or partially covered by a resin mold portion can be set as appropriate, and insulation between the core main body and a bus bar opening can be achieved. A core member 10 according to the present invention is a core member that includes a gap forming region C in which a gap 21 is formed. The core member includes an annular the core main body 20 having a bus bar opening 12 in which a bus bar 62 is disposed, a resin mold portion 30 that entirely or partially covers the core main body, the resin mold portion covering at least a portion of the (Continued)

gap forming region, and a resin bridge portion 40 whose both ends are continuously connected to the resin mold portion, and that is formed between an inner circumference side of the core main body and the bus bar opening, the resin bridge portion including a void 42 that is formed at a position opposing the gap forming region, and extends through the core member in a thickness direction of the core member between the resin bridge portion and the core main body or the resin mold portion.

9 Claims, 7 Drawing Sheets (51) Int. Cl.
*H01F 37/00* (2006.01)
*H01F 27/24* (2006.01)
*H01F 27/02* (2006.01)
*H01F 38/30* (2006.01)
*H01F 41/02* (2006.01)
*H01F 41/00* (2006.01)

(52) U.S. Cl.
CPC ........... *H01F 38/30* (2013.01); *H01F 41/005* (2013.01); *H01F 41/02* (2013.01); *H01F 41/12* (2013.01); *G01R 15/207* (2013.01)

(58) Field of Classification Search
CPC ........ H01F 27/02; H01F 27/022; H01F 38/30; H01F 41/02; H01F 41/00; H01F 41/005; H01F 41/12; H01F 37/00; H01F 27/24; H01F 3/14; H01F 41/0206

See application file for complete search history.

(56) References Cited

FOREIGN PATENT DOCUMENTS

| EP | 2 530 474 A | 5/2012 |
| JP | 05-002034 A | 1/1993 |
| JP | 2005-308527 A | 11/2005 |
| JP | 2007-088019 A | 4/2007 |

OTHER PUBLICATIONS

[Machine Translation] Japanese Unexamined Patent Publication HEI 05-2034, Aug. 1, 1993, 7 pp. (English language translation).
Japanese Patent Office, "International Search Report" (with English language translation), from corresponding publication WO 2018/061850 A1 (PCT/JP2017/033631), dated Sep. 19, 2017, 4 pp.
European Patent Office, "extended European search report (EESR)" from corresponding European Patent Application No. 17855805.2, dated May 5, 2020, 11 pp.
State Intellectual Property Office of the People's Republic of China, CN First Office Action, for corresponding Chinese patent application No. 201780060555.7 (includes English language translation), dated Jul. 3, 2020, 6 pp.

* cited by examiner

CORE MEMBER, GAPPED CORE, CURRENT SENSOR, AND METHOD FOR MANUFACTURING GAPPED CORE

TECHNICAL FIELD

The present invention relates to a gapped core, and a current sensor that includes the gapped core, and more specifically to a gapped core in which a core is partially or entirely molded using an electrically insulating resin material, and a current sensor that includes the gapped core.

BACKGROUND ART

A current sensor is known that is obtained by forming a gap in a core main body, disposing a bus bar so as to pass through a bus bar opening formed on the inner circumference side of the core main body, and disposing a magnetic sensing element in the gap (see, for example, Patent Document 1). With the gapped core for the current sensor disclosed in Patent Document 1, the annular core main body is molded using an electrically insulating resin, and thereafter the core main body is cut together with the resin mold portion by using a dicing blade (disk-shaped grindstone) so as to leave the resin mold portion on the inner circumference side of the core main body, and thereby provide insulation between the core main body and the bus bar.

CITATION LIST

Patent Document

[Patent Document 1] JP 2007-88019A

SUMMARY OF INVENTION

Technical Problem

In recent years, there is a demand for widening the gap width. However, because the dicing blade has a limited thickness, it was not possible to form a gap that is wider than the thickness of the dicing blade.

Figure 10:
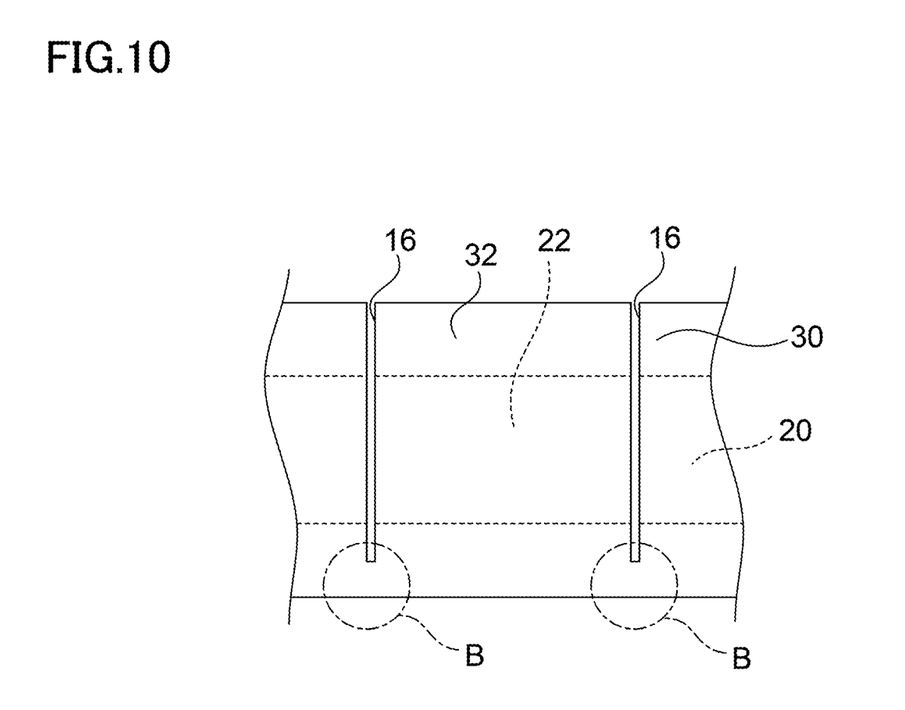
FIG. 10 is a reference diagram showing an attempt of forming a gap in a core main body of Patent Document 1 in which a resin mold portion has been formed.

Under the circumstances, the inventors of the present invention attempted to form a gap by using two dicing blades. However, when the core main body is cut so as to leave the resin mold portion on the inner circumference side of the core main body in order to provide insulation between the core main body and the bus bar, as shown in FIG. 10, it is possible to cut a core main body 20, but in a resin mold portion 30 on the inner side of the core main body 20, only two slits 16 and 16 are formed. That is, a cut core piece 22 and a resin mold portion 32 that covers the core piece 22 remain connected to the core main body 20 at circled portions B, and there is a problem in that they cannot be removed.

It is an object of the present invention to provide a core member, a gapped core, and a current sensor in which the gap width of a core main body that is entirely or partially covered by a resin mold portion can be set as appropriate, and insulation between the core main body and a bus bar opening can be achieved.

Solution to Problem

A core member according to the present invention is a core member including a gap forming region where a gap is formed, the core member including: an annular core main body having a bus bar opening in which a bus bar is disposed; a resin mold portion that entirely or partially covers the core main body, the resin mold portion covering at least a portion of the gap forming region; and a resin bridge portion whose both ends are continuously connected to the resin mold portion, and that is formed between an inner circumference side of the core main body and the bus bar opening, the resin bridge portion including a void that is formed at a position opposing the gap forming region, and extends through the core member in a thickness direction of the core member between the resin bridge portion and the core main body or the resin mold portion.

A gapped core according to the present invention includes a gap that is formed in the core member described above by cutting the core main body in the gap forming region so as to leave the resin bridge portion.

A gapped core according to the present invention includes: an annular core main body having a gap, the core main body including a first end face that constitutes the gap, and a second end face that opposes the first end face, the first end face including a first side face extending in a direction opposite to the second end face, and the second end face including a second side face extending in a direction opposite to the first end face; a first resin mold portion that covers the first side face; a second resin mold portion that covers the second side face; and a resin bridge portion that continuously connects the first resin mold portion and the second resin mold portion on an inner circumference side of the core main body.

It is desirable that the resin bridge portion has an internal width that is wider than a width of the gap.

In the core main body, side faces other than the first end face and the second end face may be entirely covered by a resin mold portion.

In the core main body, at least the first side face and the second side face may be partially covered by a resin mold portion.

A current sensor according to the present invention is a current sensor including the gapped core described above, the current sensor including: a bus bar that passes through the gapped core at a position on an inner circumference side of the resin bridge portion, and through which an electric current to be measured flows; and a magnetic sensing element that is disposed in the gap, and senses a magnetic field generated in the gap.

In the gapped core, an attachment portion for attaching the bus bar and/or the magnetic sensing element may be formed in the resin bridge portion.

A method for manufacturing a gapped core according to the present invention is a method for manufacturing a gapped core including: a mold step of partially or entirely molding a core main body using an electrically insulating resin so as to form a resin mold portion; and a cutting step of cutting the core main body together with the resin mold portion along a first cutting portion and a second cutting portion so as to form a first end face cut along the first cutting portion and a second end face cut along the second cutting portion, and form a gap between the first end face and the second end face in the core main body. The mold step includes a step of forming a resin bridge portion whose both ends are continuous with the resin mold portion on an inner circumference side of the core main body, and that has a void midway with respect to the core main body or the resin mold portion, and in the cutting step, the first cutting portion and the second cutting portion oppose the void, and the cutting is performed so as to not cut the resin bridge portion.

Advantageous Effects of Invention

With the core member according to the present invention, a gapped core can be obtained by forming a resin bridge portion having a void on the inner circumference side of the core main body, and cutting the core main body so as to not cut and leave the resin bridge portion, and the resin bridge portion can provide insulation between the core main body and the inner circumference side of the core main body. Because the core main body is cut at two locations: the first cutting portion and the second cutting portion, the width of the gap to be formed can be set as appropriate by adjusting the spacing between the first cutting portion and the second cutting portion.

Also, the resin bridge portion is formed at a position opposing the cutting portion of the core main body. The resin bridge portion functions as a reinforcement, and thus there is also an advantage of preventing the core main body from deformation during and after cutting of the core main body.

DESCRIPTION OF EMBODIMENTS

Hereinafter, a core member 10, a gapped core 50, and a current sensor 60 according to an embodiment of the present invention will be described with reference to the drawings.

Figure 1:
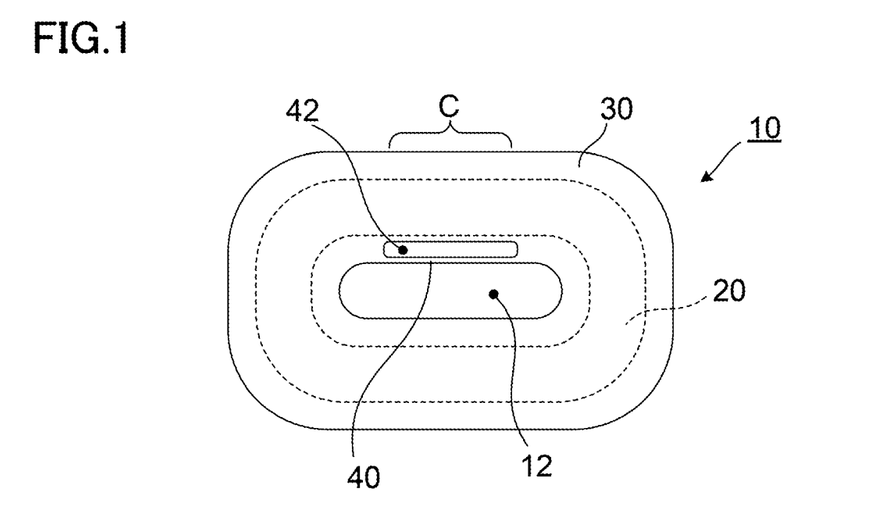
FIG. 1 is a plan view of a core member in which a resin mold portion is formed on a core main body.
Figure 2:
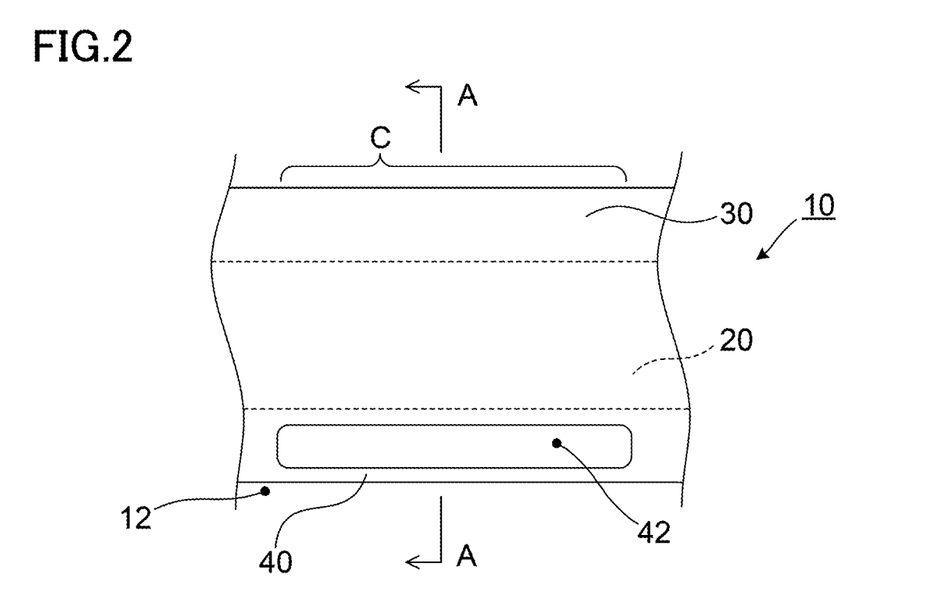
FIG. 2 is an enlarged view of the vicinity of a resin bridge portion of the core member.
Figure 3:
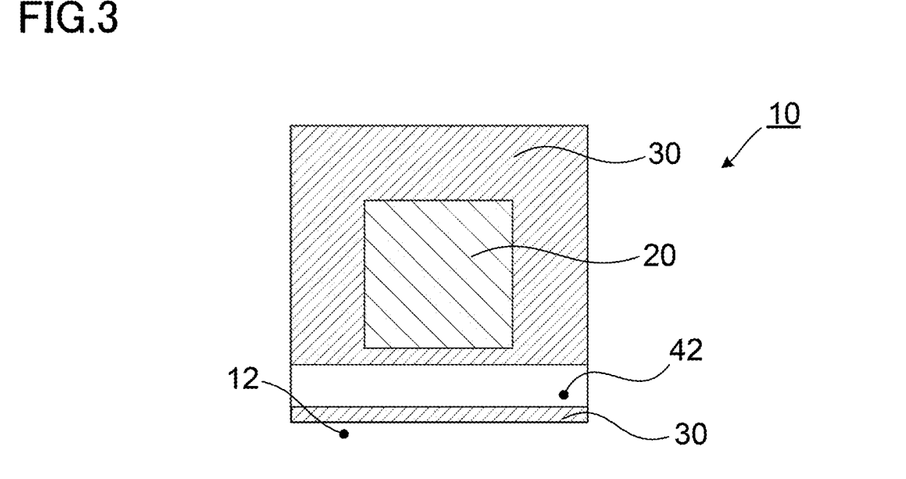
FIG. 3 is a cross-sectional view taken along the line A-A shown in FIG. 2.

FIG. 1 is a plan view of a core member 10 according to an embodiment of the present invention. FIG. 2 is an enlarged view of the vicinity of a resin bridge portion 40 of the core member 10. FIG. 3 is a cross-sectional view taken along the line A-A shown in FIG. 2. As shown in the diagrams, the core member 10 is formed by covering an annular core main body 20 by a resin mold portion 30, and is a component before a gap is formed. A gapped core 50 is produced by forming a gap 21 in the core member 10. A current sensor 60 is obtained by disposing a bus bar 62 and a magnetic sensing element 63 in the gapped core 50.

The core main body 20 can be made from a magnetic material. Examples include a wound iron core in which a thin sheet of magnetic material is wound, a laminated iron core in which annular thin sheets of magnetic material are laminated, and a dust core obtained by compression molding a magnetic material powder.

Figure 7:
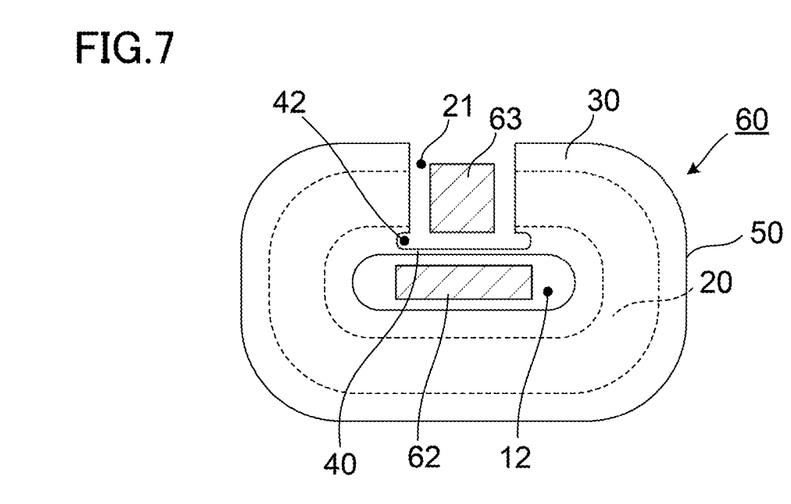
FIG. 7 is a plan view of a current sensor according to an embodiment of the preset invention.

The resin mold portion 30 is made from an electrically insulating resin. The resin mold portion 30 can be formed, for example, in a mold step of placing the core main body 20 in a die, and injecting a molten resin, through insert molding so as to be integrated with the core main body 20. At the center of the resin mold portion 30, a bus bar opening 12 through which a bus bar 62 is inserted, which will be described with reference to FIG. 7, is formed.

A gap 21 is formed in the core member 10 by cutting the core main body 20 as shown in FIGS. 4 to 7, which will be described later. In a gap forming region C that is a region where the gap 21 is to be formed, as shown in FIGS. 1 to 3, a resin bridge portion 40 is formed whose both ends are continuously connected to the resin mold portion 30 on the inner circumference side of the core main body 20, and that has a void 42 extending through the core main body 20 in a thickness direction of the core main body 20 between the inner circumference side of the core main body 20 and the bus bar opening 12. The resin bridge portion 40 and the void 42 are formed at a position opposing the gap forming region C. For example, the resin bridge portion 40 can be formed by providing a protrusion that corresponds to the void 42 on the inner surface of the die.

The thickness of the resin bridge portion 40 is greater than or equal to a minimum thickness (about 1 mm) for obtaining insulation property.

The internal width of the resin bridge portion 40, or in other words, the length of the void 42 in a direction extending along the core main body 20 is desirably wider than the width of the gap 21 to be formed. The reason will be given later.

As shown in FIGS. 1 to 3, in the core member 10 in which the resin mold portion 30 including the resin bridge portion 40 has been formed in the core main body 20, a gap 21 (see FIG. 6) is formed in the gap forming region C. The gap 21 can be formed by cutting the core member 10 using two dicing blades 70 and 71 (disk-shaped grindstone).

Figure 4:
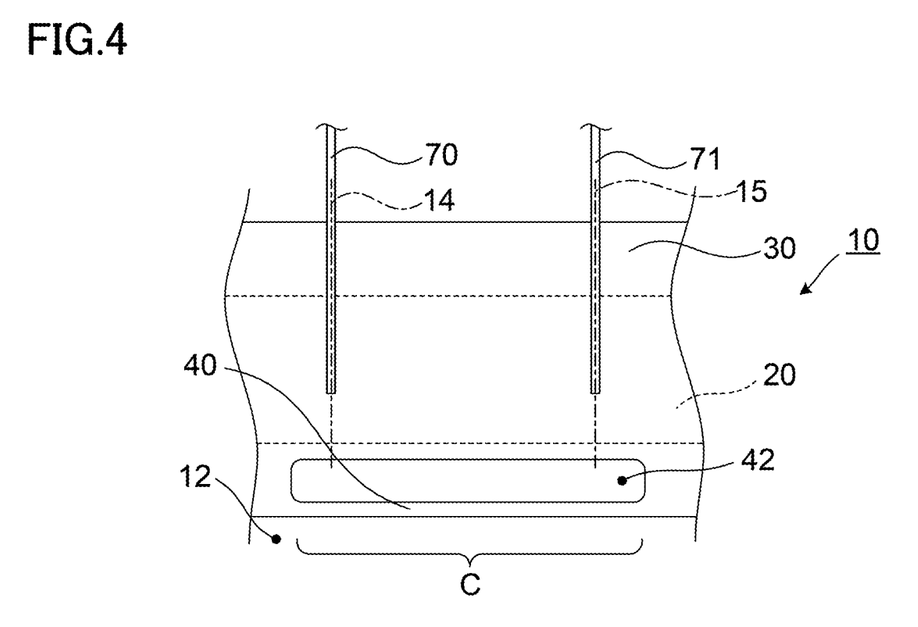
FIG. 4 is an enlarged view showing a step of forming a gap in the core member.

To be specific, as shown in FIG. 4, the core member 10 is cut by moving the dicing blades 70 and 71 along a first cutting portion 14 and a second cutting portion 15 that are at positions opposing the void 42 of the resin bridge portion 40 toward the void 42 from the outer circumference side of the core member 10 so as to form slits (cutting step). The spacing between the dicing blades 70 and 71 is adjusted to the width of the gap 21. That is, the width of the gap 21 can be set to a desired width as long as it is within the gap forming region C.

Figure 5:
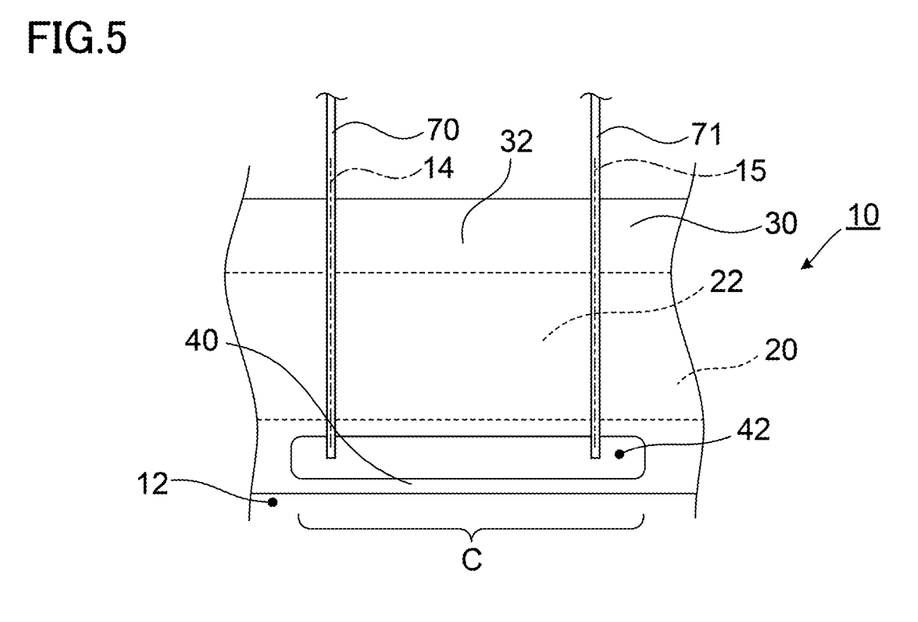
FIG. 5 is an enlarged view showing a step of forming a gap, which is performed after the step shown in FIG. 4.
Figure 6:
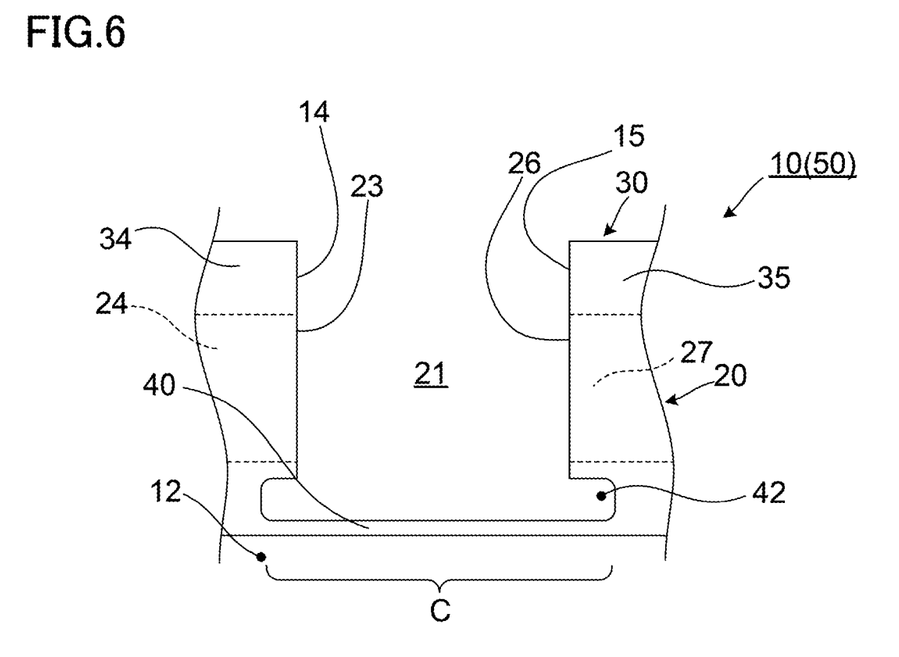
FIG. 6 is an enlarged view of the vicinity of a gap of a gapped core.

Then, the cutting step is continued until the dicing blades 70 and 71 reach the void 42 as shown in FIG. 5. As a result, a core piece 22 and a resin mold portion 32 that covers the core piece 22 are completely separated from the core member 10. As shown in FIG. 6, by removing the core piece 22 and the resin mold portion 32, a gap 21 is formed, and a gapped core 50 is thereby produced. At this time, because the resin bridge portion 40 is not cut, the resin bridge portion 40 will serve as an insulating member that provides insulation between the core main body 20 and a bus bar 62, which will be described later.

In the cutting step, cutting may be performed by simultaneously moving the two dicing blades 70 and 71 toward the core member 10. Alternatively, cutting may be performed twice using one dicing blade. Of course, if it is possible to prepare a dicing blade having a thickness that corresponds to the width of the gap 21 to be formed, the gap 21 can be formed by performing cutting once using the dicing blade.

Because the internal width of the resin bridge portion 40, or in other words, the length of the void 42 in the right left direction extending along the core main body 20 is set to be greater than the width of the gap 21, when the core member 10 is cut, the first cutting portion 14 and the second cutting portion 15 reliably reach the void 42. Accordingly, the core piece 22 and the resin mold portion 32 covering the core piece 22 can be reliably separated from the core member 10.

As described above, according to the present invention, the width of the gap 21 to be formed can be changed by adjusting the width of the void 42 formed in the resin bridge portion 40, the distance between the cutting portions 14 and 15, or in other words, the spacing between the dicing blades 70 and 71 as appropriate. Accordingly, it is unnecessary to prepare a dicing blade having a thickness that corresponds to the width of the gap 21 to be formed, and it is possible to form a gap 21 having a greater width than the thickness of the dicing blade.

Furthermore, as a result of forming the resin bridge portion 40 at a position opposing the cutting portions of the core main body 20, the resin bridge portion 40 functions as a reinforcement, and thus it is possible to prevent deformation of the core main body 20 such as enlargement of the formed gap 21 during and after cutting of the core main body 20.

Also, because the width of the gap 21 to be formed can be changed by changing the spacing between dicing blades 70 and 71, processing is possible in which only the width of the gap 21 to be formed is changed while using the same core members 10. Also, the resin mold portion 30 can be molded using the same die.

FIG. 6 is an enlarged view of the vicinity of the formed gap 21 and the resin bridge portion 40. As shown in the diagram, in the core main body 20, a first end face 23 and a second end face 26 that opposes the first end face 23 are formed by the first cutting portion 14 and the second cutting portion 15, and a gap 21 is formed by the first end face 23 and the second end face 26. Also, in the core main body 20, a first side face 24 that extends from the first end face 23 toward a direction opposite to the second end face 26 is covered by a resin mold portion (first resin mold portion 34). Likewise, a second side face 27 that extends from the second end face 26 toward a direction opposite to the first end face 23 is covered by a resin mold portion (second resin mold portion 35). The first resin mold portion 34 and the second resin mold portion 35 are continuously connected by the resin bridge portion 40 on the inner circumference side of the core main body 20. The resin bridge portion 40 has a surface as molded, and thus there is no trace of cutting by a dicing blade as in Patent Document 1. Also, because a resin is not applied to the first end face 23 and the second end face 36 of the core main body 20, after a gap has been formed in the core main body in advance, it is possible to make a distinction with a gapped core that has been resin molded.

As shown in FIG. 7, in the core 50 in which the gap 21 has been formed, a bus bar 62 is disposed so as to pass through the bus bar opening 12, and a magnetic sensing element 63 such as a Hall element is disposed in the gap 21. In this way, a current sensor 60 is obtained. By causing an electric current to be measured to flow through the bus bar 62, a change in a magnetic field generated in the gap 21 can be measured by the magnetic sensing element 63. At this time, due to the presence of the resin bridge portion 40 between the bus bar 62 and the gap 21 of the core main body 20, insulation between the bus bar 62 and the gap 21 can be achieved by the resin bridge portion 40.

Figure 8:
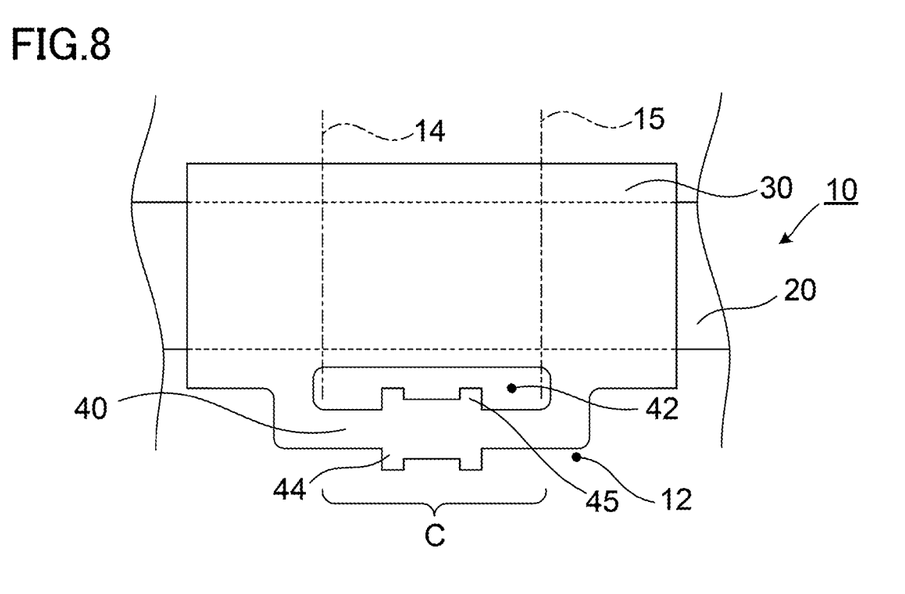
FIG. 8 is an enlarged view of the vicinity of a resin bridge portion of a core member according to another embodiment of the present invention.

In the embodiment described above, the core main body 20 is entirely covered by the resin mold portion 30. However, as shown in FIG. 8, the resin mold portion 30 may be configured to partially cover at least positions corresponding to the first cutting portion 14 and the second cutting portion 15, and the periphery thereof in the core main body 20. In the diagram, dash dot lines indicate examples of the cutting portions 14 and 15.

In FIG. 1 and other diagrams, the resin mold portion 30 is also formed between the void 42 and the core main body 20. However, the core main body 20 may be exposed at this position such that a portion of the core main body 20 serves as a wall that directly forms the void 42.

Furthermore, as shown in FIG. 8, in the resin bridge portion 40, it is also possible to form an attachment portion 44 for attaching a bus bar, and an attachment portion 45 for attaching a magnetic sensing element.

Figure 9:
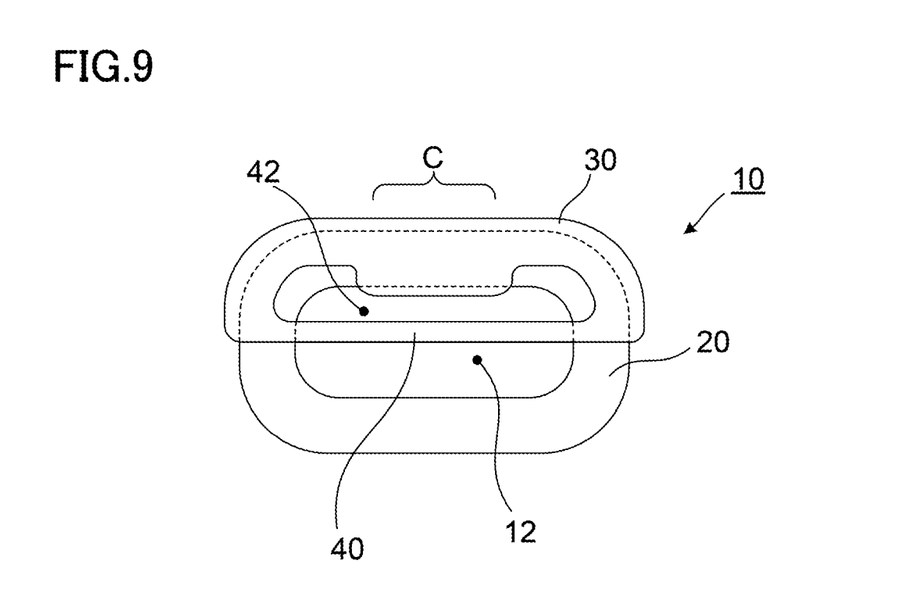
FIG. 9 is an enlarged view of the vicinity of a resin bridge portion of a core member according to a still another embodiment of the present invention.

In the embodiment described above, the resin bridge portion 40 is formed so as to protrude from the same side as the gap forming region C of the core main body 20. However, as shown in FIG. 9, the resin bridge portion 40 may be formed so as to connect two opposing sides across the gap forming region C. By continuously connecting the two opposing sides with the resin bridge portion 40 as described above, not only insulation between the bus bar and the core main body 20 can be achieved, but also the effect of suppressing deformation such as enlargement of the gap 21 in the core main body 20 during and after cutting of the core main body 20 can be enhanced because the resin bridge portion 40 functions as a reinforcement.

The foregoing description is presented to illustrate the present invention. Accordingly, it should not be construed as limiting the invention recited in the appended claims or narrowing the scope of the claims. Also, the constituent elements of the present invention are not limited to those shown in the embodiment described above, and various types of modifications can be made within the technical scope of the claims.

For example, the shapes of the core main body 20, the resin mold portion 30, and the resin bridge portion 40, the width of the gap 21 formed, and the like are not limited to those shown in the embodiment described above.

LIST OF REFERENCE NUMERALS

10 Core Member
20 Core Main Body
21 Gap
23 First End Face
24 First Side Face
25 Second End Face
26 Second Side Face
30 Resin Mold Portion
34 First Resin Mold Portion
35 Second Resin Mold Portion
40 Resin Bridge Portion
42 Void
50 Gapped Core
Current Sensor
C Gap Forming Region

The invention claimed is:

1. A core member including a gap forming region where a gap is formed, the core member comprising:
an annular core main body having a bus bar opening in which a bus bar is disposed;

a resin mold portion that entirely or partially covers the core main body, the resin mold portion covering at least a portion of the gap forming region; and a resin bridge portion whose both ends are continuously connected to the resin mold portion, and that is formed between an inner circumference side of the core main body and the bus bar opening, the resin bridge portion including a void that is formed at a position opposing the gap forming region, and extends through the core member in a thickness direction of the core member between the resin bridge portion and the core main body or the resin mold portion.

2. A gapped core comprising a gap that is formed in the core member according to claim 1 by cutting the core main body in the gap forming region such that the resin bridge portion is left.

3. The A-gapped core according to claim 2, wherein, the annular core main body having the gap, the core main body including a first end face that constitutes the gap, and a second end face that opposes the first end face, the first end face including a first side face extending in a direction opposite to the second end face, and the second end face including a second side face extending in a direction opposite to the first end face;

a first resin mold portion that covers the first side face;

a second resin mold portion that covers the second side face; and a resin bridge portion that continuously connects the first resin mold portion and the second resin mold portion on an inner circumference side of the core main body, and the first end face and the second end face are exposed end surfaces that are not covered by said first and second resin mold portions.

4. The gapped core according to claim 3, wherein the resin bridge portion has an internal width that is wider than a width of the gap.

5. The gapped core according to claim 3, wherein, in the core main body, side faces other than the first end face and the second end face are entirely covered by a resin mold portion.

6. The gapped core according to claim 3, wherein, in the core main body, at least the first side face and the second side face are partially covered by a resin mold portion.

7. A current sensor including the gapped core according to claim 3, the current sensor comprising:

a bus bar that passes through the gapped core at a position on an inner circumference side of the resin bridge portion, and through which an electric current to be measured flows; and a magnetic sensing element that is disposed in the gap, and senses a magnetic field generated in the gap.

8. The current sensor according to claim 7, wherein, in the gapped core, an attachment portion for attaching the bus bar and/or the magnetic sensing element is formed in the resin bridge portion.

9. A method for manufacturing a gapped core, comprising:

a mold step of partially or entirely molding a core main body using an electrically insulating resin so as to form a resin mold portion; and a cutting step of cutting the core main body together with the resin mold portion along a first cutting portion and a second cutting portion so as to form a first end face cut along the first cutting portion and a second end face cut along the second cutting portion, and form a gap between the first end face and the second end face in the core main body, wherein the mold step includes a step of forming a resin bridge portion whose both ends are continuous with the resin mold portion on an inner circumference side of the core main body, and that has a void midway with respect to the core main body or the resin mold portion, and in the cutting step, the first cutting portion and the second cutting portion oppose the void, and the cutting is performed so as to not cut the resin bridge portion.

* * * * *